United States Patent [19]

Imaizumi et al.

[11] Patent Number: 5,099,206
[45] Date of Patent: Mar. 24, 1992

[54] NUCLEAR MAGNETIC RESONANCE SPECTROSCOPY

[75] Inventors: Junjiro Imaizumi; Teruaki Fujito; Katsuya Hioka, all of Tokyo, Japan

[73] Assignee: Jeol Ltd., Tokyo, Japan

[21] Appl. No.: 578,667

[22] Filed: Sep. 4, 1990

[30] Foreign Application Priority Data

Sep. 4, 1989 [JP] Japan ................. 1-230216
Sep. 7, 1989 [JP] Japan ................. 1-232039

[51] Int. Cl.$^5$ ..................................... G01R 33/20
[52] U.S. Cl. ........................... 324/307; 324/300; 324/322
[58] Field of Search ............... 324/300, 308, 309, 310, 324/311, 312, 313, 318, 322; 128/653 A, 653 SC, 653 R

[56] References Cited

U.S. PATENT DOCUMENTS

| | | | |
|---|---|---|---|
| 4,511,841 | 4/1985 | Bartuska et al. | 324/321 |
| 4,875,486 | 10/1989 | Rapoport et al. | 128/653 R |
| 4,899,111 | 2/1990 | Pines et al. | 324/321 |
| 4,968,938 | 11/1990 | Pines et al. | 324/321 |
| 4,968,939 | 11/1990 | Pines et al. | 324/321 |
| 4,996,483 | 2/1991 | Beer et al. | 324/321 |

Primary Examiner—Michael J. Tokar
Attorney, Agent, or Firm—Webb, Burden, Ziesenheim & Webb

[57] ABSTRACT

There is disclosed high-resolution NMR spectroscopy in solids. Magic angle spinning and cross polarization are used in conjunction. The sample is rotated by a spinner at a high speed about an axis oriented at the magic angle 54°44' with respect to the static magnetic field. Under this condition, a 90° pulse is applied to abundant nuclear species, such as $^1H$ that is coupled to dilute nuclear species, such as $^{13}C$. Then, a spin-locking pulse or pulse sequence is applied to the abundant nuclear species. An observing pulse or pulse sequence is applied to the dilute nuclear species. The free induction decay signal from the dilute nuclear species is detected. The spin-locking pulse or the observing pulse is amplitude-modulated at a low frequency.

6 Claims, 11 Drawing Sheets

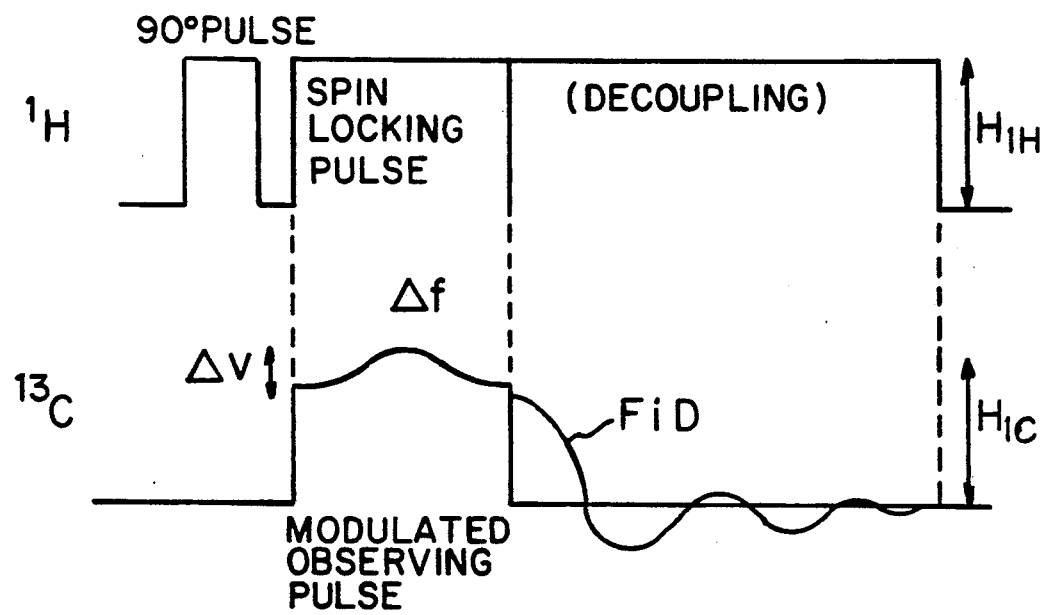
FIG. 2
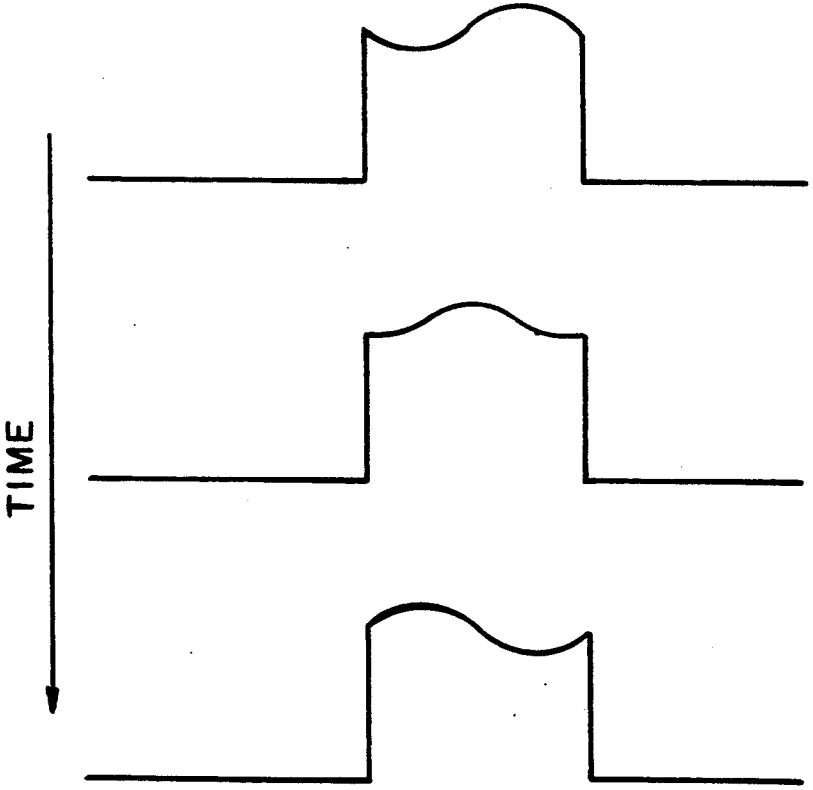
FIG. 3(a)
FIG. 3(b)
FIG. 3(c)

FIG. 12(a) RF CARRIER

FIG. 12(b) RF PULSE

FIG. 12(c) CP PULSE

FIG. 14(a) RF CARRIER
FIG. 14(b) RF PULSE
FIG. 14(c) CP PULSE

FIG. 16(a)  RF CARRIER

FIG. 16(b)  RF PULSE

FIG. 16(c)  CP PULSE

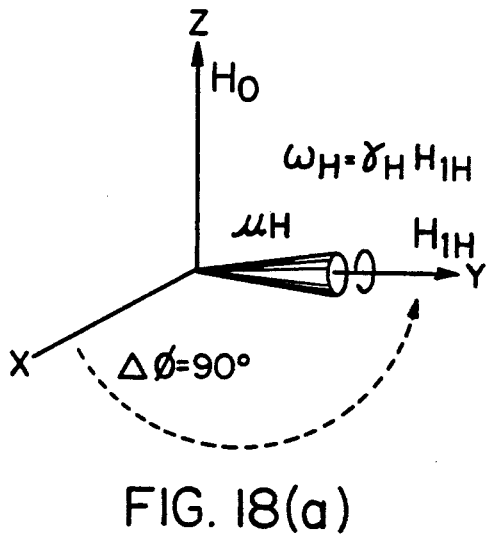
FIG. 18(a)
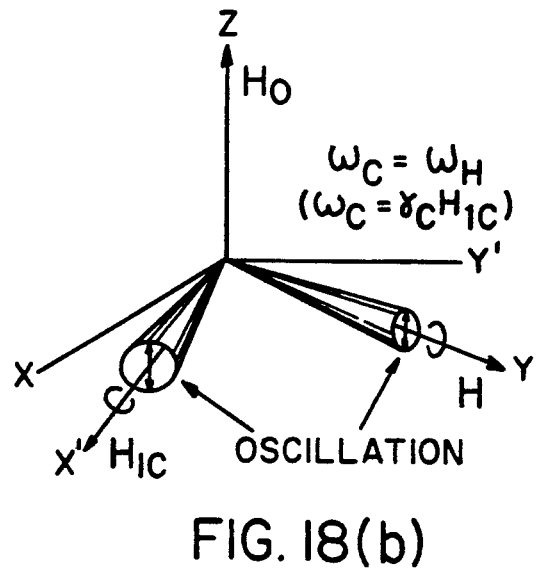
FIG. 18(b)
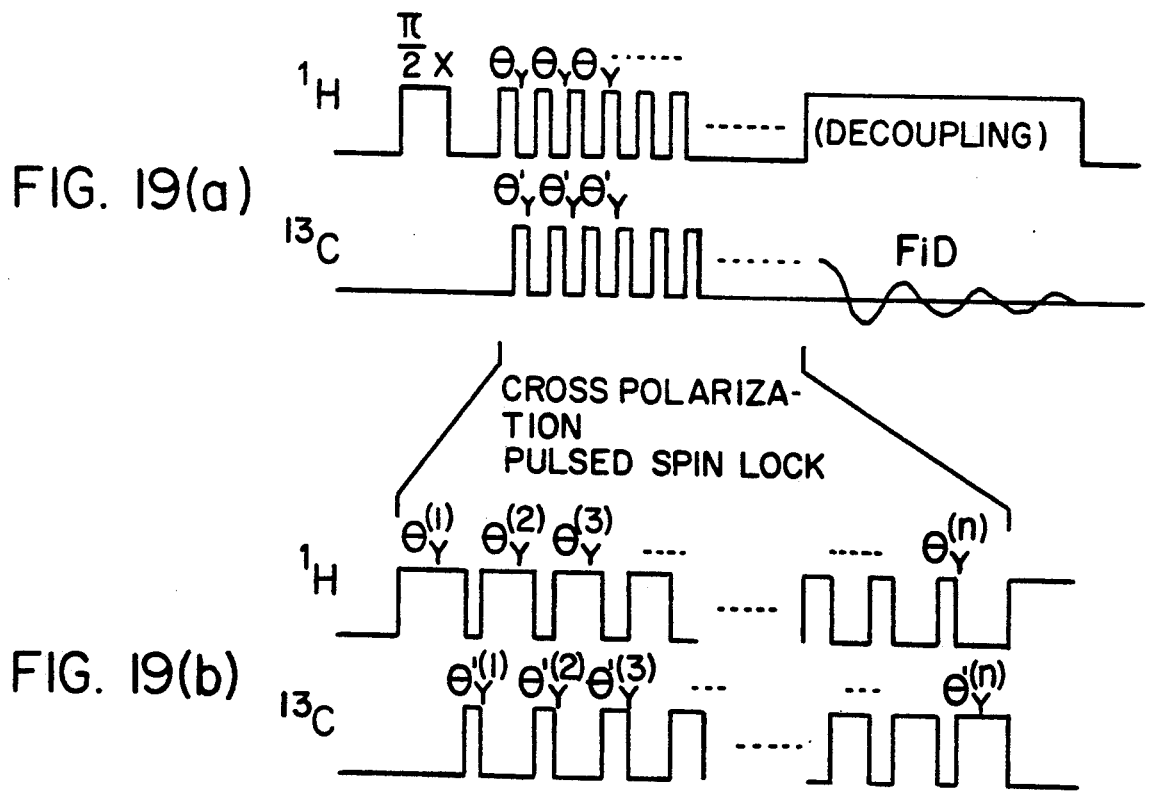
FIG. 19(a)
FIG. 19(b)

NUCLEAR MAGNETIC RESONANCE SPECTROSCOPY

FIELD OF THE INENTION

The present invention relates to solid nuclear magnetic resonance spectroscopy and, more particularly, to solid NMR techniques and an spectrometer which prevents the signal-to-noise ratio from deteriorating when a solid sample is spun at a high speed and which facilitates matching RF field amplitudes of spin locking at cross polarization.

BACKGROUND OF THE INVENTION

In solids, molecular motion is frozen and, therefore, neither anisotropy of chemical shifts (i.e., shielding of nuclei by the surrounding electrons) nor static dipolar interactions among nuclear spins are averaged out. For this reason, it is necessary to cancel or average out them in high-resolution NMR in solids. Heretofore, dipolar interaction between heteronuclear species has been eliminated by dipolar decoupling. Anisotropy of chemical shifts has been eliminated by magic angle spinning (MAS). In the MAS method, a solid sample is tilted by 54°44' (the "magic angle") with respect to the external static magnetic field and spun at a high speed of several kilohertz to average out the shield effects of the surrounding electrons. As a result, the chemical shift anisotropy is eliminated. However, where these two methods are exploited, if high abundances of homonuclear species are present in the sample, the linewidth of the spectrum is broadened by the dipolar interaction between the homonuclear species. If low abundances of homonuclear species are present such as $^{13}C$, the dipolar interaction is small. In this case, the anisotropy of the chemical shifts can be removed by rotating the sample about an axis oriented at the magic angle. However, the sensitivity is low because of the low abundances. Specifically, the natural abundance of $^1H$ is high. For the same strength of applied static magnetic field, $^1H$ resonates at a higher frequency and with stronger energy than other nuclear species. When rare spins such as $^{13}C$ are excited and $^1H$ is excited by irradiating a given RF field to make the power match with the power of the RF field applied to $^{13}C$, polarization is transferred from $^1H$ to the dilute $^{13}C$, for exciting $^{13}C$. In this way, a significant sensitivity enhancement is achieved. This method is known as cross polarization (CP). Magic angle spinning and cross polarization (CPMAS method) are used in conjunction in high-resolution NMR in solids.

We now describe cross polarization in greater detail by referring to FIG. 17. First, a 90° RF pulse is applied to $^1H$ to tilt the spins of $^1H$ toward the Y-axis, for example, as shown in FIG. 18(a). Then, the magnetization of the abundant proton spins is spin-locked with a pulse phase-shifted by 90° (i.e., the produced magnetic field is parallel to the Y-axis). An RF pulse, observing pulse, is applied to $^{13}C$ in synchronism with the spin-locking pulse (FIG. 17). The resonance frequency of protons $^1H$ is given by $\omega_H = \gamma_H B_{1H}$. The resonance frequency of $^{13}C$ is given by $\omega_C = \gamma_C B_{1C}$. The strength of the field $B_{1H}$ or the strength of the field $B_{1C}$ is controlled in such a way that the relation $\omega_H = \omega_C$ holds. As a result, polarization is transferred from $^1H$ to $^{13}C$ as shown by the thick lines in FIG. 17. Then, as shown in FIG. 18(b), the spins of $^{13}C$ are allowed to evolve within the X-Y plane (in the direction indicated by X' in the figure). The observing RF pulse is made to cease, and $^1H$ decoupling is done at the same time. Consequently, the free induction decay signal arising from the X-Y plane component of the $^{13}C$ spins is observed. The duration of the observing pulse is made different according to the kind of sample. Where $^{13}C$ is coupled strongly to $^1H$, the duration is made short. Where $^{13}C$ is weakly coupled to $^1H$, the duration is rendered long.

Where CPMAS method is used concurrently as described above, the observed signal is modulated, with sample spinning at a high speed. As a result, spinning sidebands of observed signal (SSB) appear. Especially, it is necessary for an instrument developing a strong RF magnetic field to rotate the sample at a higher speed, for reducing SSB. Unfortunately, if the rotational speed is increased, dipolar interaction decreases to deteriorate the efficiency of cross polarization. This in turn reduces the sensitivity (R. A. Wind, *J. Magn. Reson.* 79, 136 (1988)).

In an attempt to solve this problem, stop and go method (R. C. Zeigler, *J. Magn. Reson.* 79, 299 (1988)) and off angle method have been recently proposed. The stop and go method involves stopping the rotation only during the cross polarization, i.e., the time for which polarization is transferred. The off angle method consists in tilting the axis of rotation by an angle different from the magic angle only during the cross polarization.

Any of these methods need special mechanical contrivance. In particular, in the stop and go method, it is necessary to bring the sample from stationary condition to a high-speed rotation in a quite short time of tens of milliseconds. In the off angle method, the angle is required to be switched from off angle (90°) to the magic angle in a short time of several milliseconds. In any case, the method should be applied with a very special mechanical design.

Where only normal CPMAS is adopted, when the sample is spun at a high speed, the dipolar interaction between $^1H$ and $^1H$ and the dipolar interaction between $^1H$ and $^{13}C$ decrease. Therefore, the amplitudes of the RF fields must be adjusted subtly. Hence, this adjustment is difficult to make. Furthermore, since proton-proton coupling becomes weaker, the ensemble of proton spins beaks into the individual spins. In this state, the RF power requirements must be satisfied for each individual spin. This makes the cross polarization condition vague.

SUMMARY OF THE INVENTION

It is an object of the present invention to provide solid NMR spectroscopy which can easily make matching of the amplitudes of RF fields only by electrical means without requiring any special mechanical contrivance when the sample is being spun at a high speed and which can prevent the signal-to-noise ratio from deteriorating.

It is another object of the invention to provide an NMR spectrometer capable of carrying out the solid NMR spectroscopy described in the preceding paragraph.

The first-mentioned object is achieved by nuclear magnetic resonance spectroscopy comprising the steps of: rotating a sample at a high speed about an axis oriented at the magic angle with respect to a static magnetic field; simultaneously applying a 90° RF pulse to an unobserved nuclear species coupled to a nuclear species to be observed and then applying a spin-locking pulse or specific pulse sequence to the unobserved nuclear species; applying an observing pulse or specific pulse sequence to the observed nuclear species at the same time of a spin locking and detecting the resonant signal emanating from the observed nuclear species. The spectroscopy is characterized in that at least one of the time-average amplitude of spin-locking pulse or specific pulse sequence during the period of the pulse or specific pulse sequence and the time-average amplitude of the observing pulse or specific pulse sequence during the period of the pulse or specific pulse sequence is varied.

The present invention uses magic angle spinning and cross polarization in conjunction. The magic angle spinning involves rotating a solid sample at a high speed about an axis oriented at the magic angle with respect to the static magnetic field. The cross polarization involves matching the amplitude of the irradiating pulse or pulses to the amplitude of the observing pulse or pulses to excite the observed nuclear species. During the period of the observed pulse of specific pulse sequence, at least one of the time-average amplitude of the spin-locking pulse or specific pulse sequence is varied. Thus, the amplitudes can be matched without the need to critically adjust the RF field amplitudes and when the sample is spun at a high speed, the signal-to-noise ratio is prevented from deteriorating.

Other objects and features of the invention will appear in the course of the description thereof which follows.

BRIEF DESCRIPTION OF THE DRAWINGS

FIGS. 2 and 3(a), 3(b) and 3(c) are waveform diagrams illustrating the manner in which observing pulses are modulated with low-frequency signal asynchronously;

FIG. 11 is a block diagram of an NMR spectrometer according to the invention;

FIGS. 12(a) to 12(f) are time charts of the waveforms produced at various locations in the spectrometer shown in FIG. 11;

FIG. 13 is a block diagram of another NMR spectrometer according to the invention;

FIGS. 14(a) to 14(f) are time charts of the waveforms produced at various location in the spectrometer shown in FIG. 13;

FIGS. 16(a) to 16(e) are time charts of the waveforms produced at various locations in the spectrometer shown in FIG. 15;

FIGS. 17, 18(a) and 18(b) are diagrams illustrating cross polarization; and

FIGS. 19(a) and 19(b) show time charts of other pulse sequences according to the invention.

DETAILED DESCRIPTION OF THE INVENTION

Figure 1:
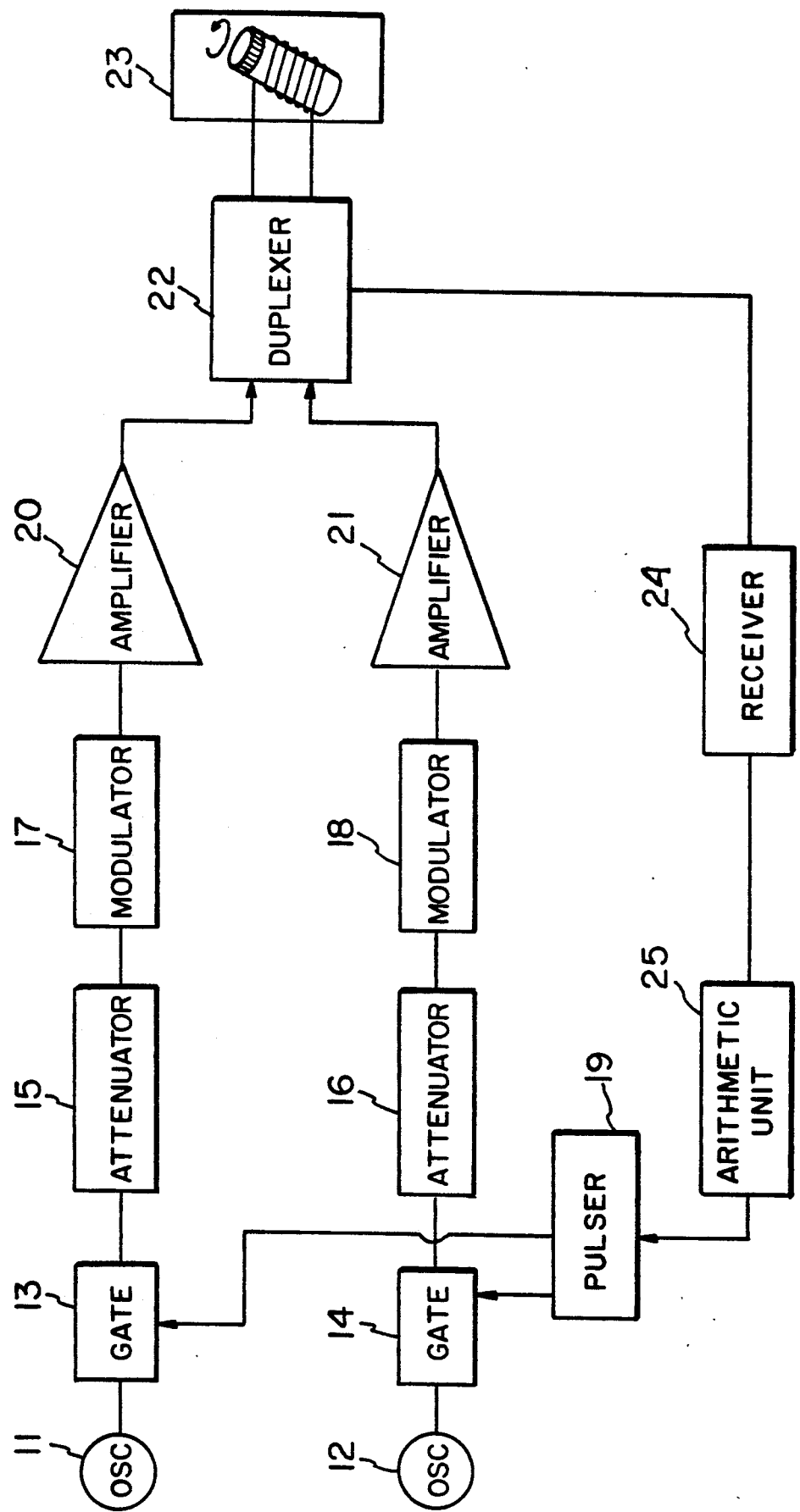
FIG. 1 is a diagram of a system carrying out cross polarization in accordance with the invention.

Referring to FIG. 1, there is shown a system effecting cross polarization in accordance with the invention. This system comprises an RF oscillator 11 for producing an RF carrier, another RF oscillator 12 for exciting an observed nuclear species, gate circuits 13 and 14, attenuators 15 and 16, modulators 17 and 18, pulser 19, power amplifiers 20 and 21, a duplexer 22, a detector 23, a receiver 24, and an arithmetic unit 25 for controlling the pulser and processing data. A solid sample (not shown) is placed inside the detector 23.

The RF oscillator 11 applies RF irradiation to abundant spins, such a proton $^1H$, to excite them. The output from the oscillator 11 is gated to the attenuator 15 by the gate circuit 13 only in the durations of the pulses from the pulser 19. If necessary, the output signal from the attenuator 15 is amplitude-modulated by the modulator 17. The output signal from the attenuator 15 is amplified by the RF power amplifier 20 and applied to the sample in the detector 23 via the duplexer 22. The operation of the pulser 19 is controlled by the arithmetic unit 25. The RF generator 12 produces an RF carrier for exciting the observed nuclear species such as $^{13}C$. The output from the oscillator 12 is applied to the sample in the detector 23 via the gate circuit 14, the attenuator 16, the power amplifier 21, and the duplexer 22, in the same way as the output from the oscillator 11. Inside the detector 23, the solid sample is spun at a high speed of several kilohertz.

Figure 17:
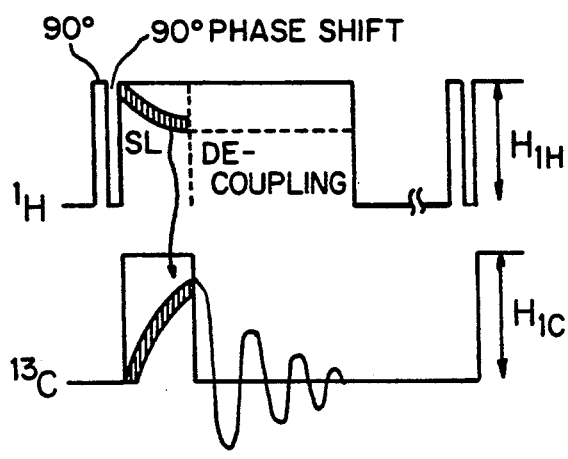

In the same way as the scheme of FIG. 17, a 90° pulse is first applied to $^1H$ Then, $^1H$ is spin locked with a pulse whose phase is shifted by 90°. An observing pulse is applied to $^{13}C$ or other nuclear species in synchronism with the spin-locking pulse. Let $B_{1H}$ and $B_{1C}$ be the strengths of the RF fields produced by both RF pulses, respectively. The strengths are so controlled that the Hartmann-Harhn condition $\gamma_H B_{1H} = \gamma_C B_{1C}$ is satisfied. In accordance with the present invention, at least one of the strengths $B_{1H}$ and $B_{1C}$ is amplitude-modulated during the period of the observing pulse or spin-locking pulse. Then, the RF power matching condition at this period (CP) can be easily fulfilled as described in greater detail later. As a result, polarization is transferred from $^1H$ to $^{13}C$, thus polarizing $^{13}C$. The resulting free induction decay signal is detected while decoupling the protons. The output signal from the detector 23 is sent to the receiver 24 via the duplexer 22 and processed by the arithmetic unit 25 to obtain a spectrum. The novel method of matching the RF field amplitudes at CP is next described.

Referring to FIG. 2, an observing pulse is amplitude-modulated with a low-frequency signal asynchronously. It is assumed that the low-frequency signal has frequency $\Delta f$ and amplitude $\Delta V$. The Hartmann-Harhn condition holds at one point within the range of amplitudes, and the spin system pulls into this condition. Polarization is transferred from $^1H$ to $^{13}C$ while the condition is maintained. In this case, if the change rate is too high, then the nuclear spins cannot follow, and the RF field amplitudes cannot be matched. For this reason, it is desired to set the modulation frequency less than 500 Hz. This is normally called adiabatic change. The degree of modulation is preferably more than several percent, though it is affected by the sample and the rotational frequency. In the past, the dipolar interaction between $^1$H and $^1$H and the dipolar interaction between $^1$H and $^{13}$C have been reduced by high-speed spinning and this has made it difficult to satisfy the cross-polarization condition. Because the protons are coupled more weakly so that individual protons are separated, the condition must be met for each individual proton. Consequently, the cross-polarization condition is made vague. On the other hand, in accordance with the present invention, the observing pulse is amplitude-modulated. This makes it easy to attain the cross-polarization condition, which in turn gives rise to a sensitivity enhancement. Thus, the signal-to-noise ratio is prevented from deteriorating.

In the present example, only the pulse applied to $^{13}$C is amplitude-modulated. If the pulse applied to $^1$H is amplitude-modulated, it is inevitable that the 90° pulse is modulated, as well as during the period of the observing pulse. That is, it is difficult to modulate only the spin-locking pulse without modulating the 90° pulse. Of course, if it is possible to modulate only the spin-locking pulse, the irradiating spins may be modulated.

The waveform of the modulated observing pulse can be a sinusoidal wave which changes with time as shown in FIGS. 3(a), 3(b), and 3(c). A triangular wave (not shown) or any other waveform changing smoothly can be used instead. In brief, the Hartmann-Harhn condition is satisfied at one point within the range of the varying amplitude. In an extreme case, a degree of modulation of 100% is possible.

Figure 4:
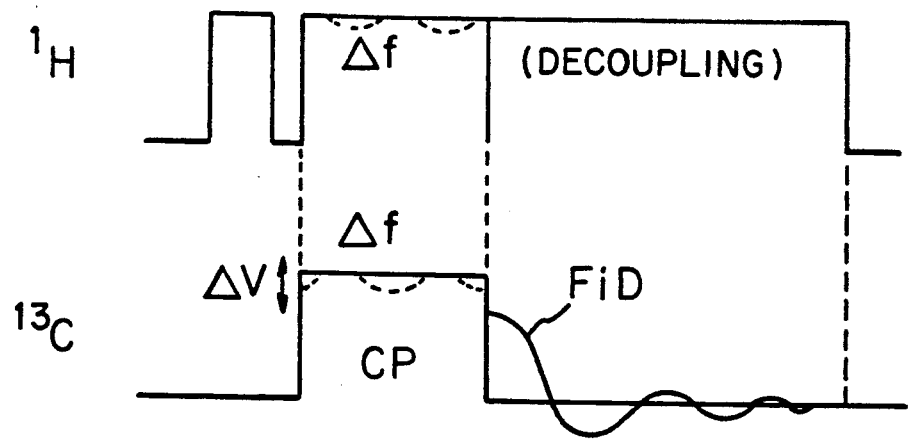
FIGS. 4, 5 and 6 are waveform diagrams illustrating the manner in which a spin-locking pulse or an observing pulse is modulated with a synchronized low-frequency signal or specific waveform.
Figure 5:
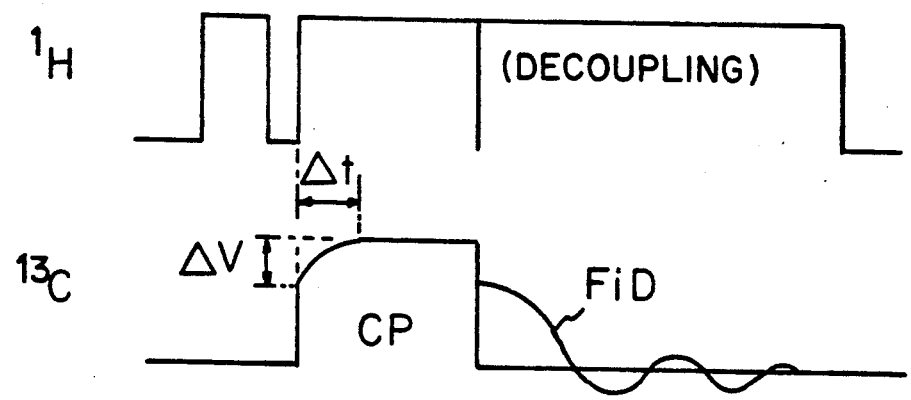
Figure 6:
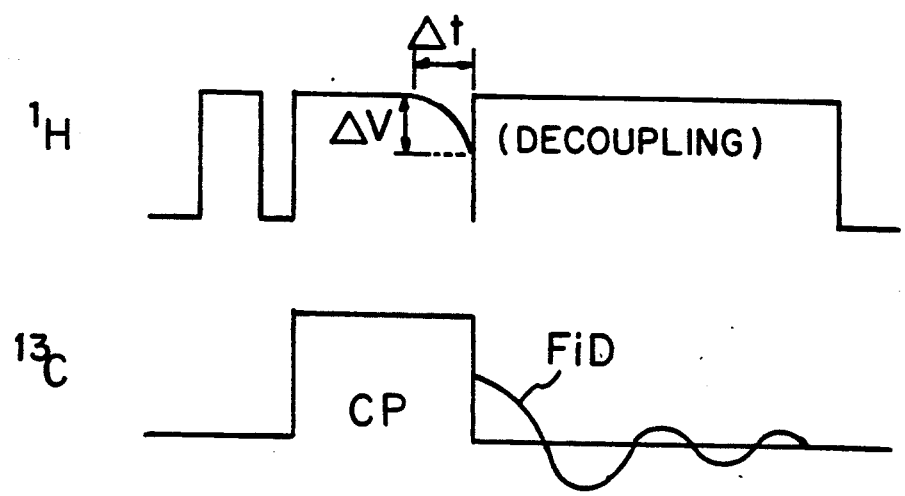

FIGS. 4, 5 and 6 show cases in which an observing pulse is amplitude-modulated with a low-frequency signal synchronized to the pulse.

FIG. 4 shows the case in which both a spinlocking pulse and an observing pulse are amplitudemodulated synchronously with signals having frequency $\Delta f$ and amplitude $\Delta V$. In order that the Hartmann-Harhn condition $\gamma_H B_{1H} = \gamma_c B_{1C}$ hold at one point during the period of the observing pulse, it is desired that the modulating signals differ in phase or amplitude. When the condition is fulfilled at some instant, the condition is maintained. As a result, the same effect can be gained as in the case of FIG. 2.

FIG. 5 shows the case in which the amplitude is increased by $\Delta V$ in time interval of $\Delta t$ on the leading edge of an observing pulse. FIG. 6 shows the case in which the amplitude is reduced by $\Delta V$ in time interval $\Delta t$ on the trailing edge of a spin-locking pulse. The Hartmann-Harhn condition is satisfied at one point while the amplitude is being varied. These schemes are also effective for many soft samples by setting the time interval $\Delta t$ to about 1 msec and the amount of change in amplitude $\Delta V$ to a degree of modulation of about 20%.

Figure 7:
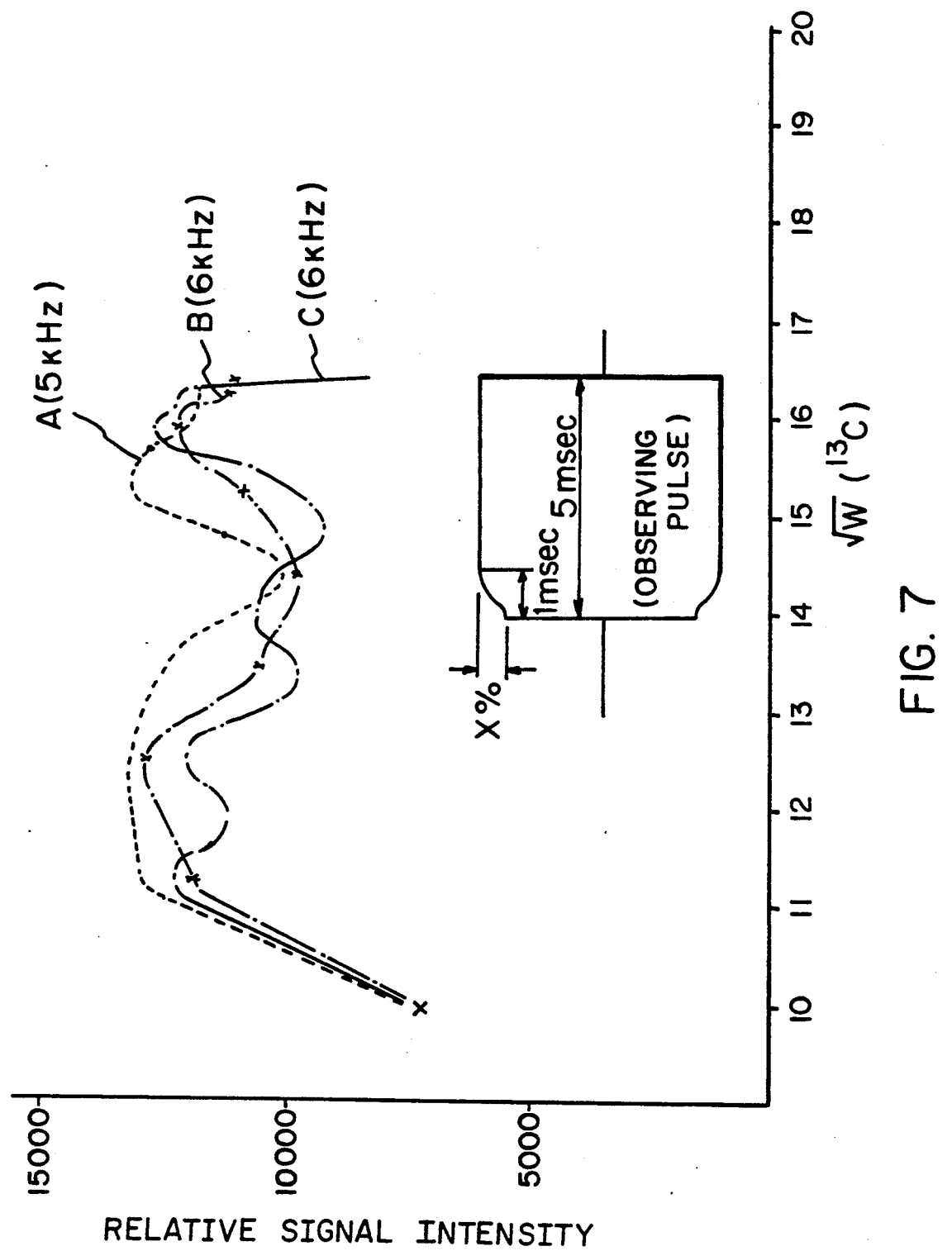
FIG. 7 is a graph showing the relation of the amplitude of the produced signal to observing RF power when $^{13}C$ is observed by a method according to the invention.
Figure 8:
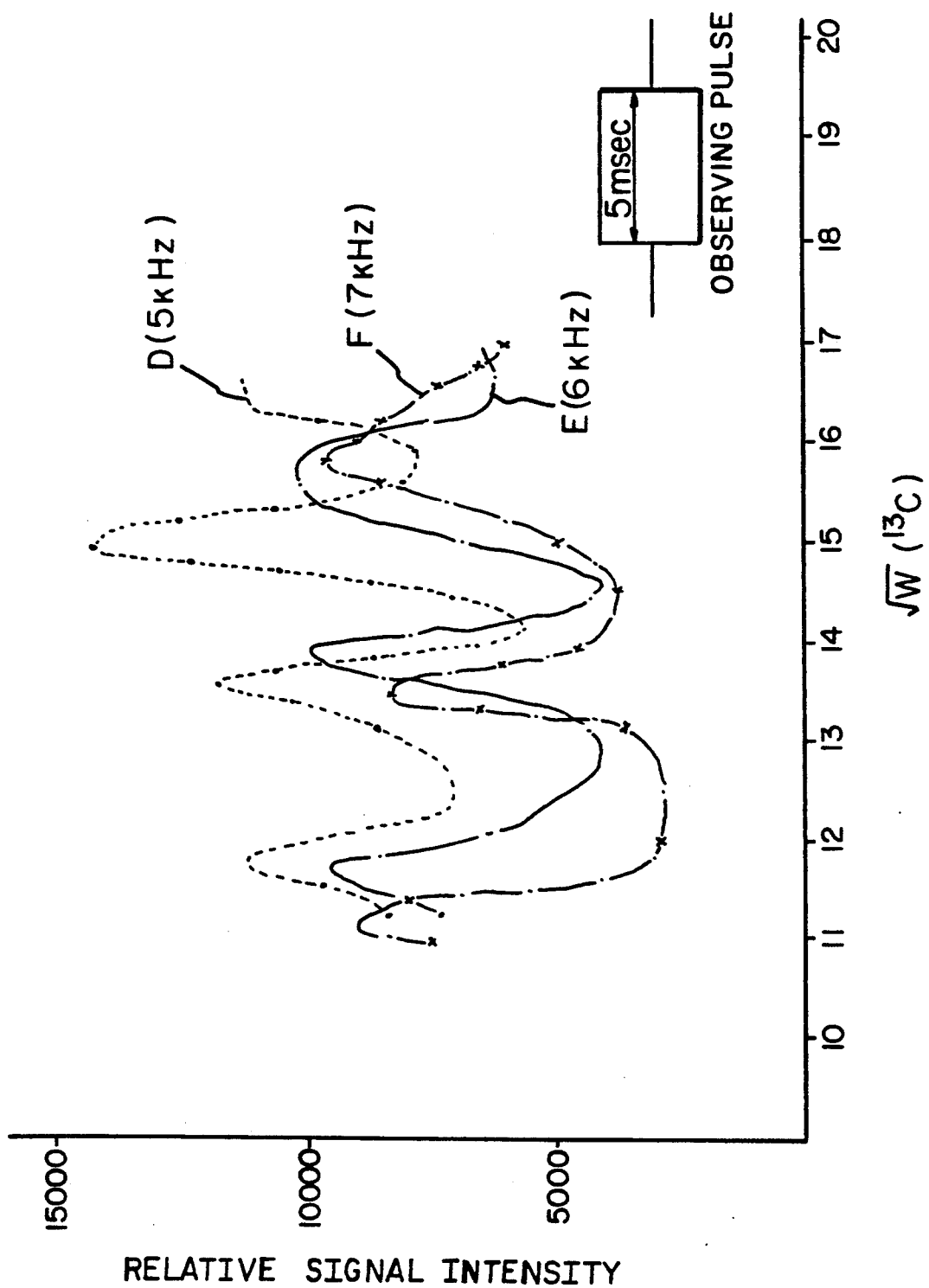
FIG. 8 is a graph similar to FIG. 7, but in which $^{13}C$ is observed by the conventional method.

FIG. 7 is a graph showing the relation of the amplitude of the detected signal to the observing RF power for cross polarization when the amplitude of an observing pulse is smoothly increased on the leading edge. FIG. 8 is a graph similar to FIG. 7, but in which the measurement was made by the conventional method. In these graphs, the amplitude of the signal is plotted on the vertical axis (in arbitrary units) and the square root of the observing RF power on the horizontal axis (in W). In FIG. 7, the observing pulse had a duration of 5 msec. Curve A was obtained under the conditions: the rotational speed of the spinner=5 kHz, $\Delta t$=1 msec, $\Delta V$=20%. Curve B was derived under the conditions: the rotational speed of the spinner=6 kHz, $\Delta t$=1 msec, $\Delta V$=40%. Curve C was obtained under the conditions: the rotational speed of the spinner=6 kHz, $\Delta t$=1 msec, $\Delta V$=20%. In FIG. 8, the observing pulse had a duration of 5 msec. Curves D, E, and F were obtained when the spinner rotational speed was 5 kHz, 6 kHz, 7 kHz, respectively.

As can be seen from FIG. 8, as the rotational speed of the spinner was increased to 6 kHz and then to 7 kHz, the signal amplitude dropped. When the rotational speed was reduced to increase the signal amplitude, the characteristic curve D (5 kHz) was sharp. This made the matching condition more critical. Consequently, the adjustment had to be made meticulously to satisfy the matching condition.

On the other hand, in accordance with the present invention, as can be seen from FIG. 7, the signal amplitude did not drop in spite of high-speed rotation at 6 kHz. Furthermore, the characteristic curve was flat. Therefore, the power requirements can be readily catered for without requiring strict adjustment.

In the schemes shown in FIGS. 4–6, the modulation frequency is made proportional to the reciprocal of the duration of the observing pulse. Thus, the nuclear spins can be made to follow the changes in the amplitude by slowly changing the amplitude when the cross-polarization period is long and by rapidly changing the amplitude when the cross polarization period is short.

Figure 9:
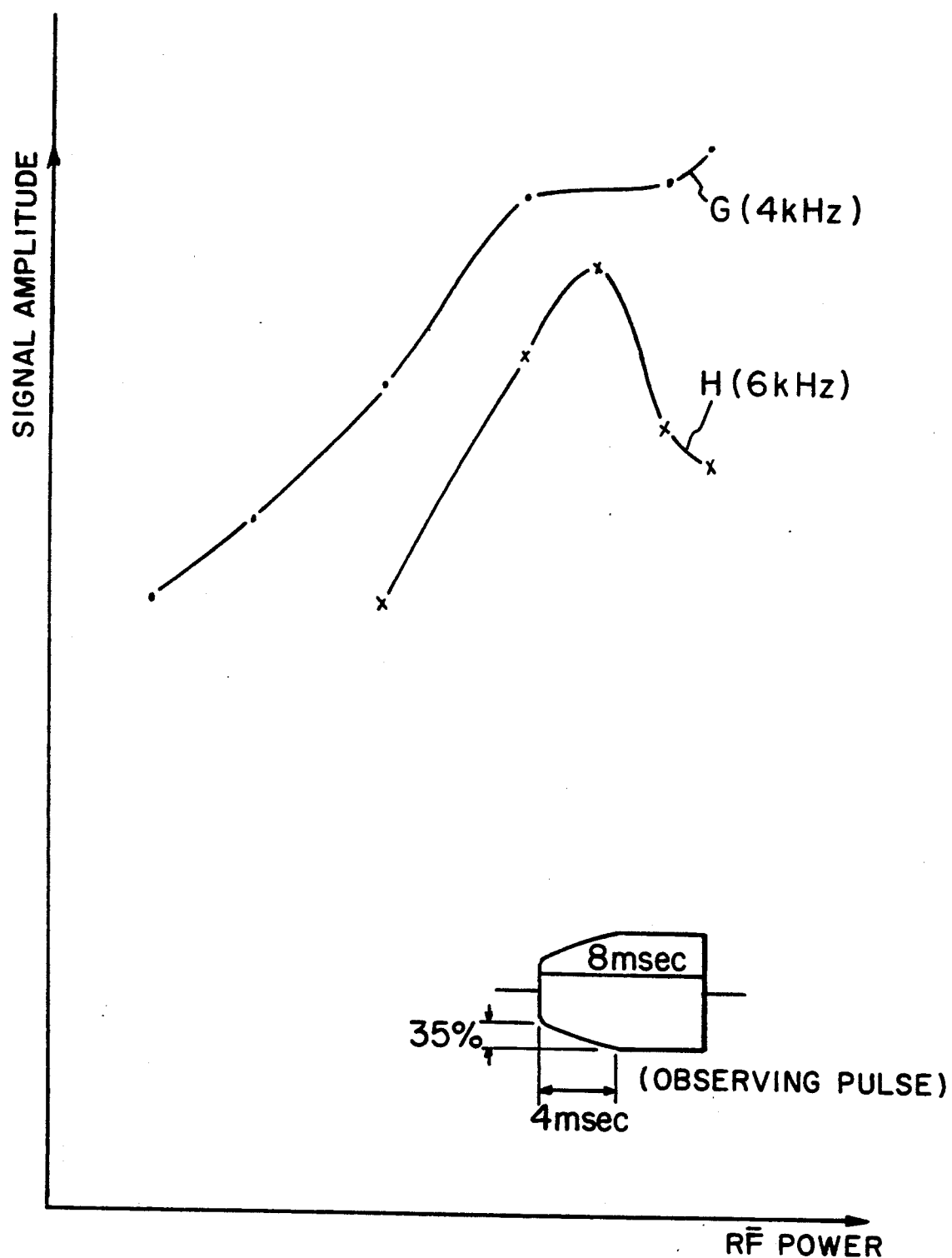
FIG. 9 is a graph showing the relation of the amplitude of the signal produced from $^{15}N$ to the observing RF power for cross polarization when a modulation is made with a signal having a frequency proportional to the reciprocal of the duration of an observing pulse.
Figure 10:
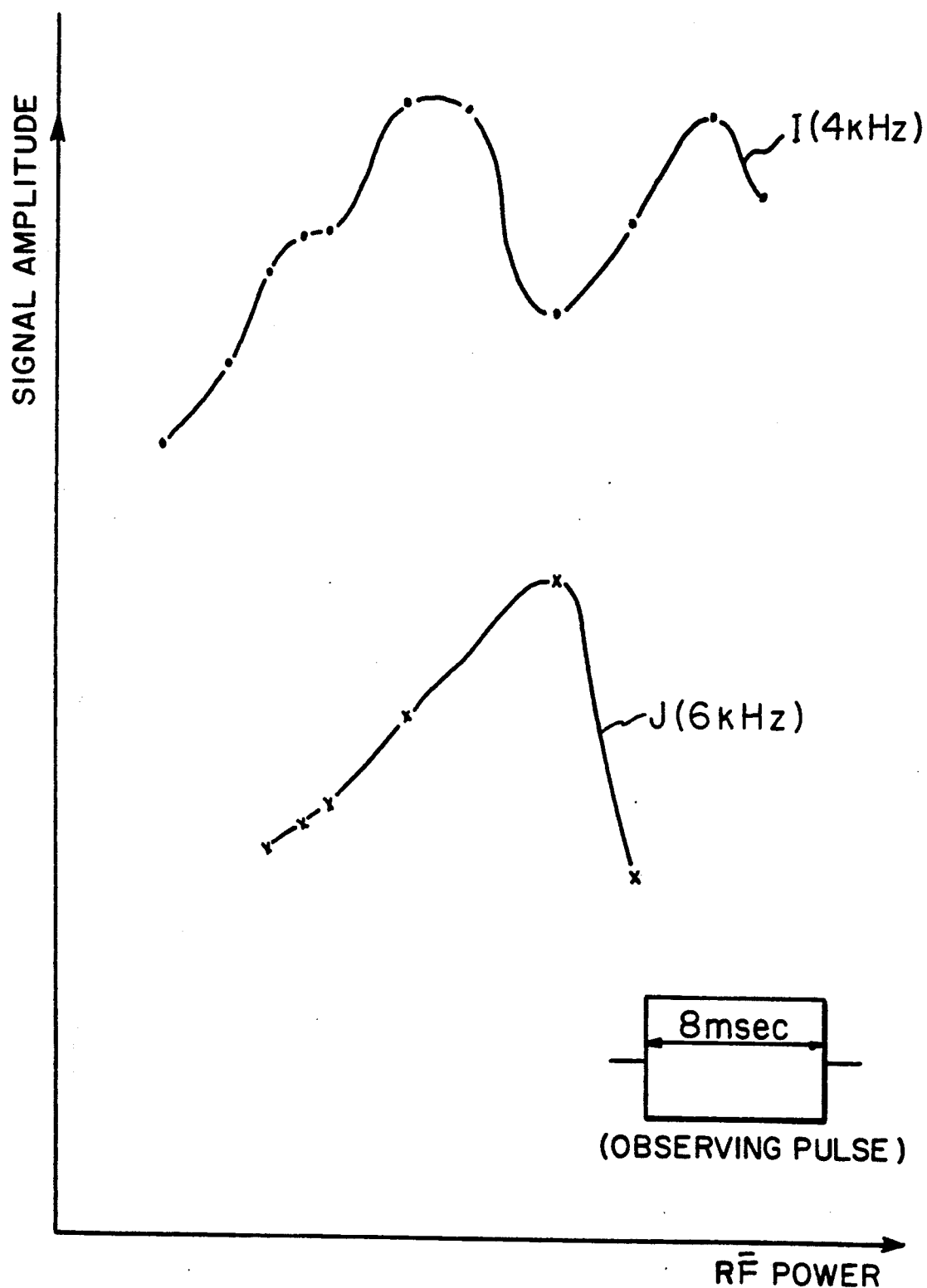
FIG. 10 is a graph similar to FIG. 9, but in which $^{15}N$ is observed by the conventional method.

FIG. 9 is a graph showing the relation of the amplitude of the signal emanating from $^{15}$N to the RF power consumed for cross polarization when the modulation frequency is made proportional to one-fourth of the reciprocal of the duration of the observing pulse. FIG. 10 is a graph similar to the graph of FIG. 9, but in which the prior art CP (cross polarization) MAS (magic angle spinning) was used. In FIG. 9, the duration of the observed pulse was 8 msec, $\Delta t$ was 4 msec, and $\Delta V$ was 35%. Curve G was obtained when the rotational speed was 4 kHz. Curve H was derived when the rotational speed was 6 kHz. In FIG. 10, the duration of the observing pulse was 8 msec. Curve I was obtained when the rotational speed of the spinner was 4 kHz. Curve J was obtained when the rotational speed was 6 kHz.

As can be seen from FIG. 10, when the prior art method was adopted, the rotational speed of the spinner was set to a high speed of 6 kHz, the amplitude of the signal was very low. When the rotational speed was reduced down to approximately 4 kHz to enhance the sensitivity, the characteristic curve became sharper. That is, it was more difficult to satisfy the power matching condition. On the other hand, as can be seen from FIG. 9, a great sensitivity enhancement was achieved in spite of high-speed rotation at 6 kHz, by amplitude-modulating the observing pulse with the signal whose frequency was proportional to the reciprocal of the duration of the observing pulse. Also at the frequency of 4 kHz, the characteristic curve became flat. In this way, the matching condition was moderated.

Figures 11, 12D, 12E, 12F:
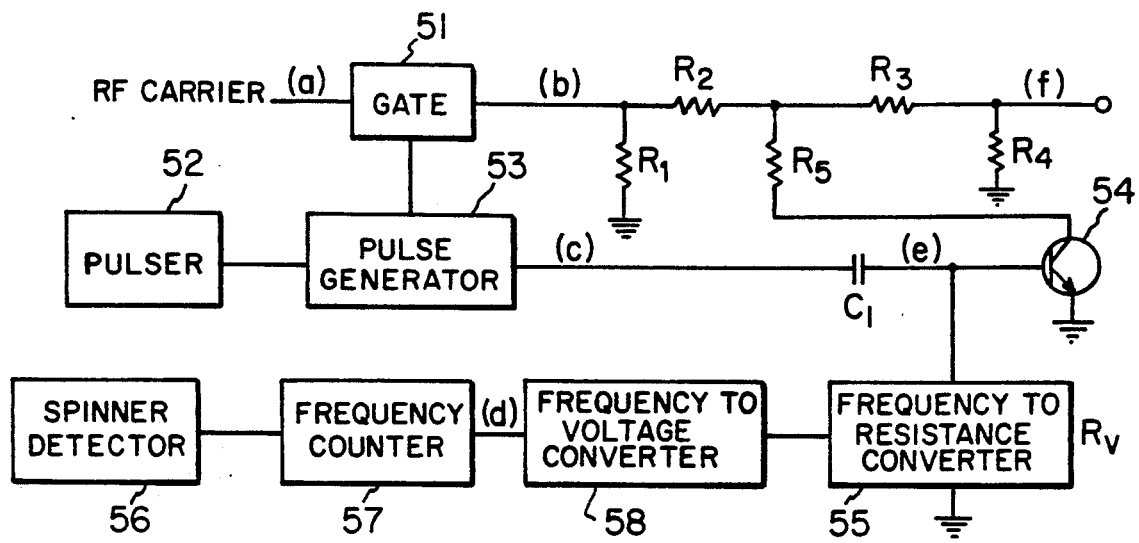

FIG. 11 is a block diagram of an NMR spectrometer according to the invention. FIG. 12 is a time chart of the waveforms at various locations in the spectrometer. This spectrometer includes an RF gate circuit 51, a pulser 52, a CP (cross polarization) pulse or observing pulse generator 53 connected with the gate circuit 51 and also with the pulser 52, a transistor 54 connected with the output of the pulse generator 53 via a capacitor $C_1$, a spinner detector 56, a frequency counter 57 connected with the output of the detector 56, a frequency-to-voltage converter 58 connected with the counter 57, and a frequency-to-resistance converter 55 connected with the output of the converter 58. $R_1$–$R_5$, $R_v$ are resistors. The capacitor $C_1$ and the resistor $R_v$ of the converter 55 form a differentiator circuit.

As shown in FIGS. 12(a) to 12(f), RF carrier (FIG. 12(a)) is applied to the RF gate 51. The CP pulse generator 53 creates a CP pulse (FIG. 12(c)) from the pulses sent from the pulser 52 and supplies the CP pulse to the RF gate 51. Since this gate 51 is gated by the CP pulse (FIG. 12(c)), RF pulses (FIG. 12(b)) appear at the output of the gate 51. The CP pulse (FIG. 12(c)) is applied to the base of the transistor 54 via the differentiator circuit consisting of $C_1$ and $R_v$. The output pulses from the spinner detector 56 are counted by the frequency counter 57, which produces pulses (FIG. 12(d)) of a frequency corresponding to the rotational speed of the spinner. The frequency-to-voltage converter 58 generates a voltage corresponding to the rotational speed. This voltage is converted into resistance $R_v$ by the voltage-to-resistance converter 55. In this way, the CP pulse (FIG. 12(c)) is differentiated by the differentiator circuit having the resistance $R_v$ leaded with the rotational speed of the spinner, to give rise to differentiated waveform FIG. 12(e). This differentiated signal controls the transistor 54 so as to vary the value of the attenuator consisting of the resistors $R_1$–$R_5$. As a result, output pulses FIG. 12(f) whose leading edges vary according to the rotational speed of the spinner are obtained. The amount of change $\Delta V$ in the amplitude of the output pulses is determined by the resistor $R_5$. The time $\Delta t$ for which the amplitude changes is determined by the capacitor $C_1$ and the resistance $R_v$. In this way, when the rotational frequency of the spinner is high and the dipolar interaction is small, the time $\Delta t$ is increased to vary the amplitude slowly. When the rotational frequency is low and the dipolar interaction is large, the time $\Delta t$ is shortened so that the amplitude may change rapidly. In this manner, polarization can be efficiently transferred from $^1$H to $^{13}$C in any case.

Figures 13, 14D, 14E, 14F:
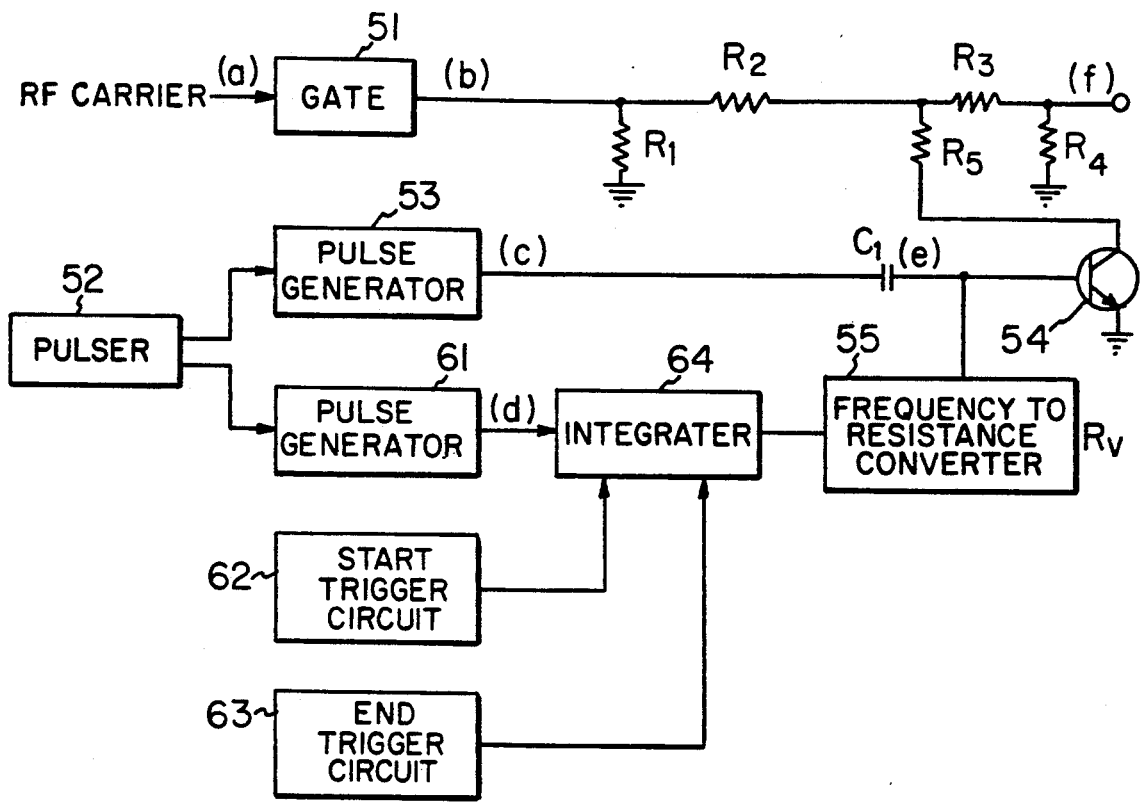

FIG. 13 shows another NMR spectrometer according to the invention. FIGS. 14(a) to 14(f) illustrate the waveforms produced at various locations in this spectrometer. This NMR spectrometer is similar to the spectrometer shown in FIG. 11 except that the spinner detector 56, the frequency counter 57, and the frequency-to-voltage converter 58 are replaced by a pulse generator 61, a start trigger circuit 62, an end trigger circuit 63, and an integrator 64. The pulse generator 61 is connected to the output of the pulser 52 and acts to determine the time constant of the integrator 64.

In the operation of this NMR spectrometer, the pulse generator 61 produces a pulse (FIG. 14(d)) of a given duration. The start trigger circuit 62 produces a start trigger pulse on the leading edge of the pulse (FIG. 14(d)) to reset the integrator 64. The end trigger circuit 63 produces an end trigger pulse on the trailing edge of the pulse (FIG. 14(d)) to hold the integrated value. The output from the integrator 64 is in proportion to the duration of the pulse (FIG. 14(d)) produced by the pulse generator 61. The output from the integrator is converted into resistance $R_v$ by the voltage-to-resistance converter 55. The CP pulse (FIG. 14(c)) is differentiated by the differentiator circuit consisting of the capacitor $C_1$ and the resistance $R_v$. In the same way as the instrument shown in FIG. 11, the value of the attenuator is varied to produce output pulses whose leading edges vary at a rate corresponding to the duration of the pulse (FIG. 14(d)) which determines the time constant of the integrator. The amount of change $\Delta V$ in the amplitude of the output pulses is determined by the resistance $R^5$ and the time $\Delta t$ for which the amplitude changes is determined by $C_1$ and $R_v$, in the same way as in the instrument shown in FIG. 11.

Figure 15:
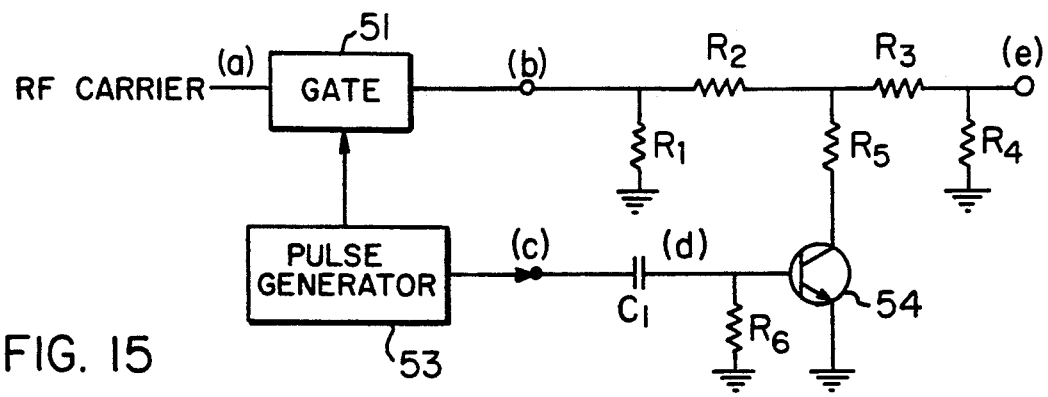
FIG. 15 is a block diagram of a further NMR spectrometer according to the invention.
Figure 16D:
Figure 16D:
Figure 16D:
Figure 16E:
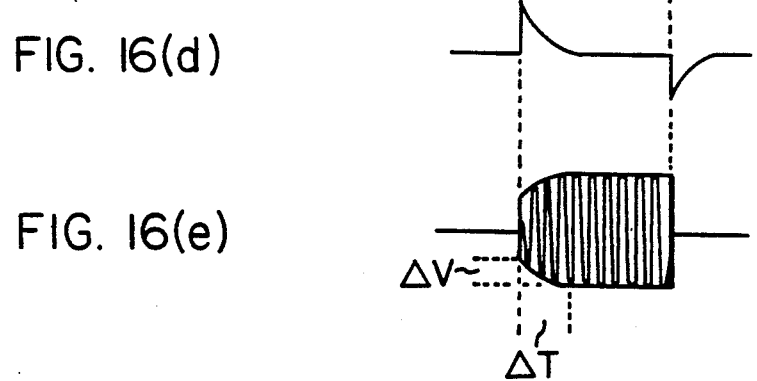

FIG. 15 shows a further NMR spectrometer according to the invention. FIGS. 16(a) to 16(e) are the waveforms produced at various locations in this spectrometer. This NMR spectrometer is similar to the spectrometer shown in FIG. 11 except that some components are omitted and that a resistor $R_6$ is added instead of $R_v$. A differentiator circuit is formed by the capacitor $C_1$ and the resistor $R_6$ without using the variable resistor $R_v$. The CP pulse is directly differentiated by the differentiator circuit, and the value of the attenuator is varied by the resulting signal. In the present example, therefore, the amount of change $\Delta V$ in the output pulses is determined by the resistor $R_5$. The time $\Delta t$ is determined by the capacitor $C_1$ and the resistor $R_6$.

In the descriptions made in connection with FIGS. 11–16, the observing pulse is amplitude-modulated. Obviously, the present invention can also be applied to an instrument in which a spin-locking pulse is amplitude-modulated. Where a spin-locking pulse sequence or an observing pulse sequence is used, the amplitude of each pulse of the sequence may be modulated.

It is also possible to substantially vary the time-average amplitude by changing the duration of each pulse of a pulse sequence or the intervals between the pulses. This scheme is now described by referring to FIG. 19. In this example, the used instrument is essentially the same as the instrument shown in FIG. 1. As shown in FIG. 19(a), a 90° pulse is first applied to $^1$H. Then, a pulse sequence phase-shifted by 90° is applied at flip angle $\theta_y$ to spin-lock $^1$H. Simultaneously, an observing pulse sequence is applied to $^{13}$C or other nuclear species at flip angle $\theta_y'$. Let $B_{1H}$ and $B_{1C}$ be the strengths of the RF magnetic fields produced by the irradiation of the RF pulse sequences, respectively. The amplitudes of the RF fields are matched such that the relation $\theta_y = \theta_y'$ holds. In the present example, at least one of the two pulse sequences is pulse duration-modulated to vary the amplitude of the irradiating RF field. This makes it easier to satisfy the RF power requirements as described later. As a result, polarization is transferred from $^1$H to $^{13}$C, thus polarizing $^{13}$C. The resulting free induction decay signal is detected while decoupling the protons. Referring again to FIG. 1, the output signal from the detector is sent to the receiver 24 via the duplexer 22. The output signal from the receiver 24 is processed by the arithmetic unit 25 to obtain a spectrum.

The novel method of matching the RF field amplitudes is next described. As shown in FIG. 19(b), the duration of each pulse of a spin-locking pulse sequence applied to $^1$H is modulated in such a way that the durations of the successive pulses ($\theta_y^{(1)}$, $\theta_y^{(2)}$, $\theta_y^{(3)}$, . . . ) are narrowed gradually. The durations of the individual pulses ($\theta_y'^{(1)}$, $\theta_y'^{(2)}$, $\theta_y'^{(3)}$, . . . ) of an observing pulse sequence applied to $^{13}$C or other nuclear species are increased gradually. The amplitudes of the RF fields produced by the pulse sequences are matched at one point in the process of varying the spin system. The matched condition is maintained by pulling-in, and polarization is transferred from $^1$H to $^{13}$C. In this case, if the change rate is too high, the spins cannot follow, making it impossible to satisfy the RF power requirements. Therefore, the change rate must be made low. After the cross polarization, decoupling is effected, and the free induction decay signal stemming from $^{13}$C is observed. Subjected to pulse-duration modulation is either the pulse-locking pulse sequence or the observing pulse sequence or both. If no modulation is made, continuous waves may be utilized. Preferably, the degree of modulation is in excess of several percent.

In the above example, the durations of the pulses of a pulse sequence are modulated. The time-average amplitude of the pulses can be varied by changing the intervals between the pulses while retaining the pulse durations constant.

Having thus described our invention with the detail and particularity required by the Patent Laws, what is claimed and desired to be protected by Letters Patent is set forth in the following claims.

What is claimed is:

1. Nuclear magnetic resonance spectroscopy comprising the steps of:
    rotating a sample at a high speed about an axis oriented at the magic angle with respect to a static magnetic field;
    simultaneously applying a 90° pulse to an unobserved nuclear species coupled to a nuclear species to be observed and then applying a spin-locking pulse or pulse sequence to the unobserved nuclear species;
    applying an observing pulse or pulse sequence to the observed nuclear species;
    detecting the resonant signal emanating from the observed nuclear species;
    and wherein at least one of the time-average amplitude of the spin-locking pulse or pulse sequence during the period of the pulse or pulse sequence and the time-average amplitude of the observing pulse or pulse sequence during the period of the pulse or pulse sequence is varied.

2. The nuclear magnetic resonance spectroscopy of claim 1, wherein at least one of the spin-locking pulse or pulse sequence and the observing pulse or pulse sequence is amplitude-modulated with a low-frequency signal synchronously or asynchronously.

3. The nuclear magnetic resonance spectroscopy of claim 1, wherein at least one of the spin-locking pulse or pulse sequence and the observing pulse or pulse sequence is amplitude-modulated at a low frequency proportional to the reciprocal of the duration or durations of the observing pulse or pulse sequence.

4. The nuclear magnetic resonance spectroscopy of claim 1, wherein a spin-locking pulse sequence and an observing pulse sequence are used, and wherein at least one of the spin-locking pulse sequence and the observing pulse sequence is varied in time-average amplitude by changing the intervals between the pulses of the pulse sequence.

5. A nuclear magnetic resonance spectrometer comprising:
    a means for rotating a sample at a high speed about an axis oriented at the magic angle with respect to a static magnetic field;
    a means for applying a 90° pulse to an unobserved nuclear species coupled to a nuclear species to be observed and then applying a spin-locking pulse or pulse sequence to the unobserved nuclear species;
    a means for applying an observing pulse or pulse sequence to the observed nuclear species;
    a means for detecting the resonant signal emanating from the observed nuclear species; and
    a modulating means for varying at least one of the time-average amplitude of the spin-locking pulse or pulse sequence during the period of the pulse or pulse sequence and the time-average amplitude of the observing pulse or pulse sequence during the period of the pulse or pulse sequence.

6. The nuclear magnetic resonance spectrometer of claim 5, wherein the modulating means is equipped with a means for varying the modulation period according to the rotational speed of the sample.

* * * * *

UNITED STATES PATENT AND TRADEMARK OFFICE
CERTIFICATE OF CORRECTION

PATENT NO. : 5,099,206
DATED : March 24, 1992
INVENTOR(S) : Junjiro Imaizumi, Teruaki Fujito and Katsuya Hioka It is certified that error appears in the above-identified patent and that said Letters Patent is hereby corrected as shown below:

Title page, after [73] Assignee: "Jeol Ltd." should read --JEOL Ltd.--.

Column 1 Line 8 after "an" insert --NMR--.

Column 4 Line 40 "$^1$H Then," should read --$^1$H. Then,--.

Column 5 Line 39 "spinlocking" should read --spin-locking--.

Column 5 Line 40 "amplitudemodulated" should read --amplitude-modulated--.

Column 8 Line 7 "$R^5$" should read --$R_5$--.

Signed and Sealed this

Twenty-ninth Day of June, 1993

Attest:

MICHAEL K. KIRK

*Attesting Officer*    *Acting Commissioner of Patents and Trademarks*